United States Patent
Schmidt

(10) Patent No.: US 7,880,272 B2
(45) Date of Patent: Feb. 1, 2011

(54) SEMICONDUCTOR DEVICE WITH NEAR-SURFACE COMPENSATION DOPING AREA AND METHOD OF FABRICATING

(75) Inventor: Gerhard Schmidt, Wernberg/Wudmath (AT)

(73) Assignee: Infineon Technologies AG, Neubiberg (DE)

( * ) Notice: Subject to any disclaimer, the term of this patent is extended or adjusted under 35 U.S.C. 154(b) by 378 days.

(21) Appl. No.: 11/343,512

(22) Filed: Jan. 31, 2006

(65) Prior Publication Data

US 2006/0197159 A1     Sep. 7, 2006

(30) Foreign Application Priority Data

Jan. 31, 2005     (DE) .................. 10 2005 004 355

(51) Int. Cl.
  *H01L 21/02*     (2006.01)
(52) U.S. Cl. ............... 257/611; 257/655; 257/E29.005; 257/E29.012; 438/350
(58) Field of Classification Search .......... 257/629, 257/652, 655, 657, 611, E29.005, E29.012–E29.014; 438/350, 514
  See application file for complete search history.

(56) References Cited

U.S. PATENT DOCUMENTS

| | | | | |
|---|---|---|---|---|
| 4,434,543 A * | 3/1984 | Schwabe et al. | ............ | 438/217 |
| 4,593,302 A * | 6/1986 | Lidow et al. | ................. | 257/342 |
| 4,667,393 A * | 5/1987 | Ferla et al. | ................. | 438/529 |
| 5,675,166 A * | 10/1997 | Ilderem et al. | ............... | 257/345 |
| 6,215,168 B1 * | 4/2001 | Brush et al. | .................. | 257/494 |
| 6,380,013 B2 * | 4/2002 | Lee | ............................ | 438/184 |

FOREIGN PATENT DOCUMENTS

| DE | 198 18 296 | 8/1999 |
|---|---|---|
| DE | 103 24 100 | 12/2004 |

OTHER PUBLICATIONS

Pelka, J., "Untersuchung Spezieller Randkonturen Hochsperrender P+N-Übergänge Zur Vermeidung Von Oberflächendurchbrüchen" Von Fachbereich Elektrotechnik der Technischen Universität Berlin zur Verleihung des akademischen Grades Dokter—Ingenieur Vorgelegte Dissertation, D 83, pp. 78 (Berlin 1983).
Stengl, R. et al., "Surface Breakdown and Stability of High-Voltage Planar Junctions," IEEE Transactions on Electron Devices, vol. 38, No. 9, pp. 2181-2188 (Sep. 1991).
Stengl, R. et al., "Variation of Lateral Doping as a Field Terminator for High-Voltage Power Devices," IEEE Transactions of Electron Devices, vol. 1, Ed-33, No. 3, pp. 426-428 (Mar. 1986).

* cited by examiner

*Primary Examiner*—Lex Malsawma
*Assistant Examiner*—Robert Huber
(74) *Attorney, Agent, or Firm*—Dicke, Billig & Czaja, PLLC

(57) ABSTRACT

Aspects of the present invention include a semiconductor device and method. In a transition region of a semiconductor material region, a near-surface compensation doping area with a conductivity type, which is different than the conductivity type of a transition doping area of the semiconductor material region, is provided in the surface region of the semiconductor material region. The doping of the near-surface compensation doping area of the semiconductor device at least partially compensates for the doping in the transition doping area.

20 Claims, 8 Drawing Sheets

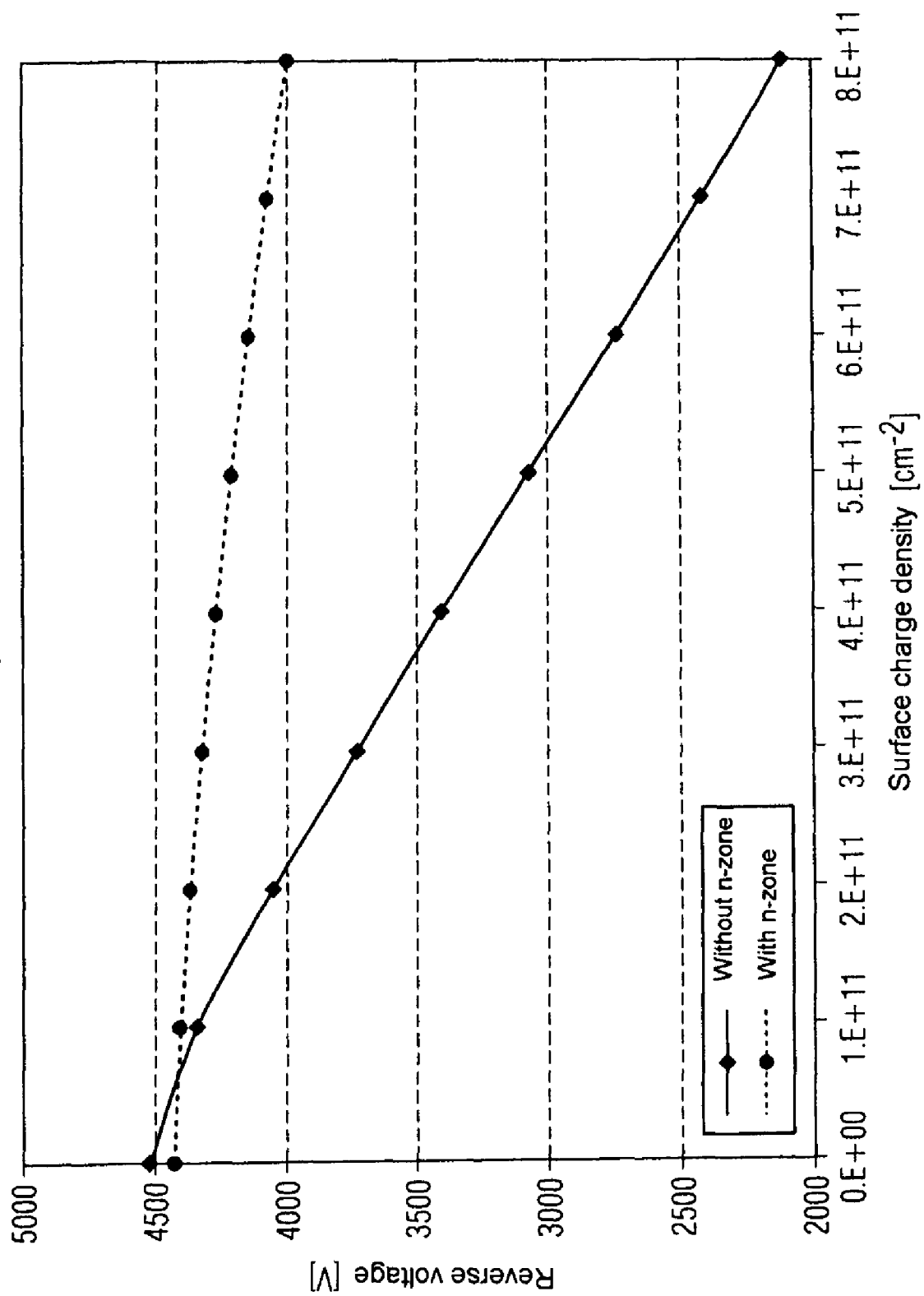

SEMICONDUCTOR DEVICE WITH NEAR-SURFACE COMPENSATION DOPING AREA AND METHOD OF FABRICATING

CROSS-REFERENCE TO RELATED APPLICATIONS

This Utility Patent Application claims priority to German Patent Application No. DE 10 2005 004 355.0, filed on Jan. 31, 2005, which is incorporated herein by reference.

BACKGROUND

The present invention relates to a semiconductor device and to a method for fabricating it. The present invention relates in particular to a VLD edge termination with a near-surface zone having or formed from an opposite conductivity type.

When forming semiconductor devices, for example semiconductor circuit elements in an underlying semiconductor material region, certain edge structures are required in order to achieve certain physical or circuitry properties of the corresponding semiconductor element or of the component. The edge structures in each case relate to the edge region which develops in the edge of a semiconductor element or of a semiconductor device. With regard to the wafer, this may quite easily be an area in the interior of the wafer at a location remote from the edge of the wafer. The edge position and therefore the corresponding edge structure then apply after integrated circuits and/or discrete components produced have been singulated.

Previous procedures used to produce edge structures have been relatively complex, and a large number of different mask processes, which are matched and adjusted to one another, are frequently required in order to enable the required edge structures with their specific properties to be produced.

High-voltage semiconductor components require edge structures in order to achieve the necessary dielectric strength. These edge structures have hitherto been very complex. Examples include SIPMOS and IGBT power transistors and high-voltage diodes.

The main role of a high-voltage chip edge is to control the electrical field strength in the region between the active area and the sawn edge of the component. To avoid premature breakthroughs in the blocking state, the electrical field strength at the edge must not exceed the maximum values which occur in the active region. The objective is for the equipotential lines to be passed in a defined way out of the interior of the component in the chip edge to the surface, that is, the invention relates inter alia to field line or equipotential line management.

In this context, it should be ensured that curves and the density of the equipotential lines do not cause any excessively high field, that is, cause premature punch-throughs in the component, for example as a result of an avalanche breakdown in Si or as a result of a dielectric breakdown in oxide and passivation layers.

A virtually ideal distribution of the surface field strength ensures a so-called VLD edge termination (VLD=Variation of Lateral Doping), in which the gradual attenuation of the lateral doping profile is set in such a way that a constant electrical field strength results at the surface of the semiconductor over virtually the entire edge width.

The VLD principle has been described in R. Stengl et al., IEEE Trans. ED 33, 426 (1986). A method for realizing a VLD high-voltage edge with a low junction depth can be realized, for example, using special mask techniques for lateral dose attenuation when introducing the dopant via ion implantation. A method of this type also comprises, for example, introducing a dopant in the case of ion implantation through a resist mask with a laterally varying opening ratio and subsequently causing the doping to flow by means of a high-temperature process.

FIG. 1 diagrammatically depicts the structure of an edge termination of this type. To keep the chip outer edge, at which the sawn edge is present, potential-free, a channel stopper is generally incorporated, at which further propagation of the space charge region is to be stopped.

FIG. 2 illustrates the result of a simulation of the potential distribution for a high-voltage diode, as designed for a rated voltage of 3.3 kV, having an edge termination of this type. The simulations were carried out using the BREAKDOWN program J. Pelka, Dissertation, TU Berlin (1983).

This example is specifically based on the following structural data:

The n-doped base material has a resistivity of 350 $\Omega$cm and a thickness of 375 µm. The vertical and lateral diffusion depth of the $p^+$ anode area is 6 µm, and the surface concentration of the latter is $5 \cdot 10^{18}$ cm$^{-3}$.

A surface concentration of $1 \cdot 10^{18}$ cm$^{-3}$ was used for the $n^+$ channel stopper. Its width is 10 µm, and the total edge width is 860 µm. The VLD zone extends as far as the channel stopper, and the maximum junction depth at the anode is equal to the latter. The depth of the cathode-side $n^+$ zone and its edge concentration were set at 20 µm and $2 \cdot 10^{15}$ cm$^{-3}$.

The maximum blocking capability in the bulk of the component with these basic dimensions is approximately 4800 V.

When optimizing the lateral dose profile and the value for the VLD maximum dose with a view to keeping the electrical field strength at the semiconductor surface at a constant value, an implantation dose of $1.4 \cdot 10^{12}$ cm$^{-2}$ results in the profile of the lateral acceptor dose distribution, the potential distribution and the field distribution illustrated in FIG. 3. The reverse voltage is in this case 4525 volts.

On account of the relatively low edge width, the reduction in potential before the channel stopper is built up slightly and a field strength peak is formed at this location. Nevertheless, if the edge is too narrow, the channel stopper is unable to prevent the space charge region from penetrating into the region of the vertical chip edge, FIG. 2. Since the sawn edge is normally present here, this at least leads to increased leakage currents and in extreme cases can even lead to an electrical sparkover from the chip edge to the anode.

Moreover, the field strength peak at the channel stopper constitutes a further problem, because it is associated with a high field gradient which represents the driving force for the build-up of charge carrier peaks which may be caused by the separation of external charges in or on the passivation layer. In the case of a dielectric passivation, this effect ultimately leads to a very strong and undesirable drift in the blocking capability and to surface breakdowns at the $n^+$ channel stopper R. Stengl and E. Falck, IEEE Trans. On Electron Dev., Vol. 38, No. 9, September 1991, pp. 2181-2188.

To prevent the space charge region from penetrating into the edge region, the edge would have to be made wider, in this case at least 1200 µm. Although this would reduce the field peak at the channel stopper, it would not eliminate it altogether.

SUMMARY

Aspects of the present invention include a semiconductor device and method. In a transition region of a semiconductor material region, a near-surface compensation doping area with a conductivity type, which is different than the conductivity type of a transition doping area of the semiconductor material region, is provided in the surface region of the semiconductor material region. The doping of the near-surface compensation doping area of the semiconductor device at least partially compensates for the doping in the transition doping area.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

FIG. 8 is a graph illustrating a comparison of certain component parameters between the prior art and the semiconductor device according to the invention.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments my be utilized and structural or logical changes may be made without departing from the scope of the present invention. The following detailed description, therefore, is not to be taken in a limiting sense, and the scope of the present invention is defined by the appended claims.

Figure 4:
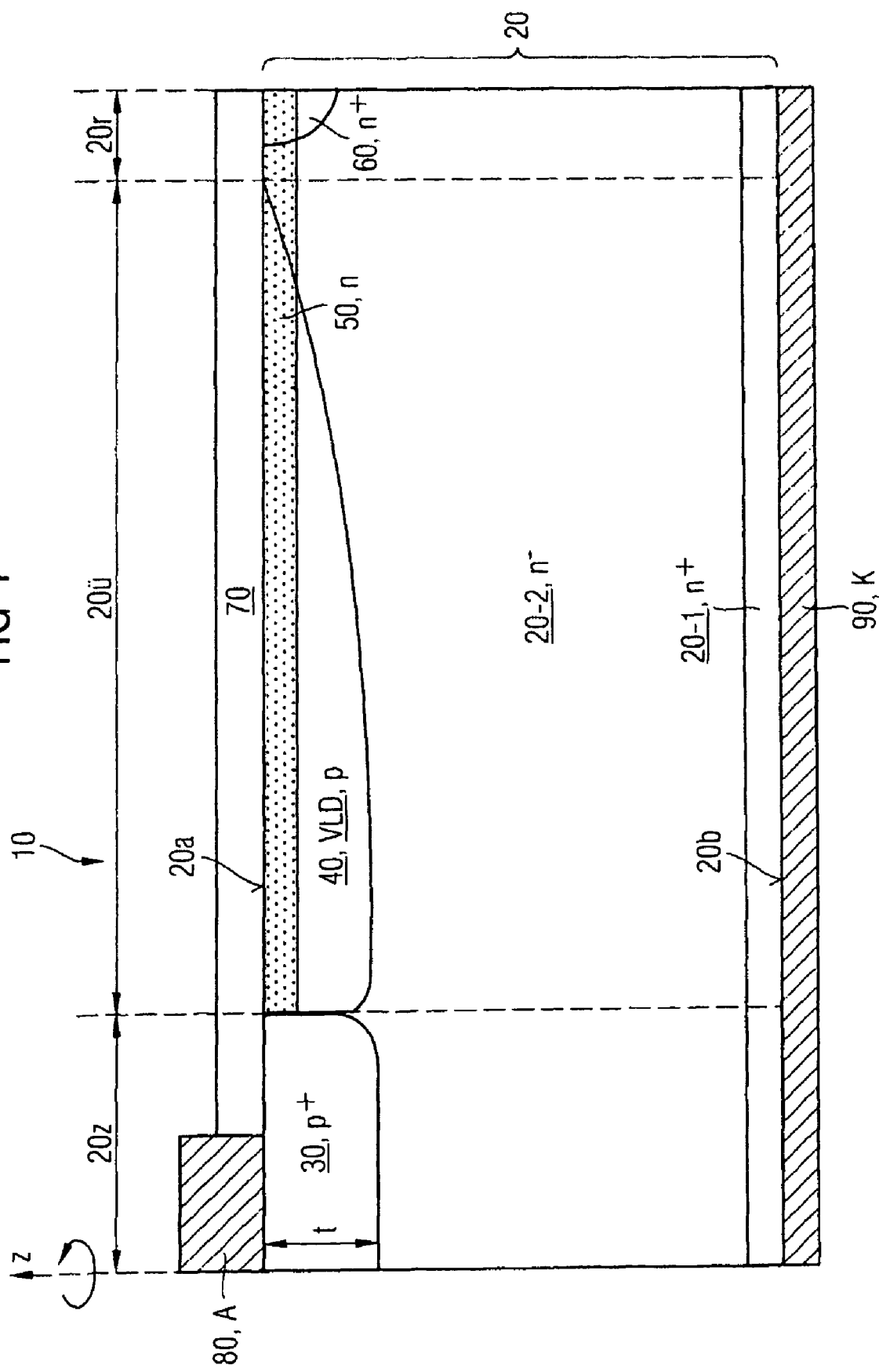
FIG. 4 illustrates a diagrammatic and sectional side view of an embodiment of a semiconductor device according to the invention.

One exemplary embodiment is the high-voltage diode described and illustrated in FIG. 4. According to one embodiment of the invention, the proposed edge termination can also be transferred to other high-voltage power components.

Further exemplary embodiments include application to SIPMOS or COOLMOS power transistors, JFETs, IGBTs or Schottky diodes comprising or based on Si and/or SiC.

In one embodiment of the invention, an additional near-surface zone, of the opposite conduction type to the VLD zone, is introduced with a laterally constant dose, that is, in the case shown an n-doped zone, FIG. 4. The dose value of this zone is lower than the maximum dose, and its penetration depth is lower than the junction depth of the VLD area at the anode. This results in a laterally smooth transition from the n-doping to the p-doping in the run-out region of the VLD zone, since on account of the p-dose increasing toward the anode, this constant n-doping is compensated for to an ever greater extent until it ultimately drops completely into the p-doping and is covered by the latter.

If the dose is sufficiently high, the introduction of an n-zone of this type obviates the need for the $n^+$ channel stopper. This is also an attractive option in terms of the production process, since it allows one photographic level to be saved.

In technological terms, the n-zone can be produced, for example, by means of full-surface implantation without the need for an additional photo technique, since the relatively low n-dose in the other areas with a very much higher doping cannot manifest itself.

Alternatively, this can also be realized by means of true surface charging in the form of surface donors. These require a suitable passivation system, such as for example a semi-insulating amorphous layer, in which these positively charged surface charges can form by means of deep energy states caused by band bending at the amorphous/crystalline junction. Their existence or density is set by selecting the deposition conditions or if appropriate by doping. Suitable examples include layers of amorphous silicon, carbon or silicon carbide which are deposited directly on the semiconductor surface.

Figure 5:
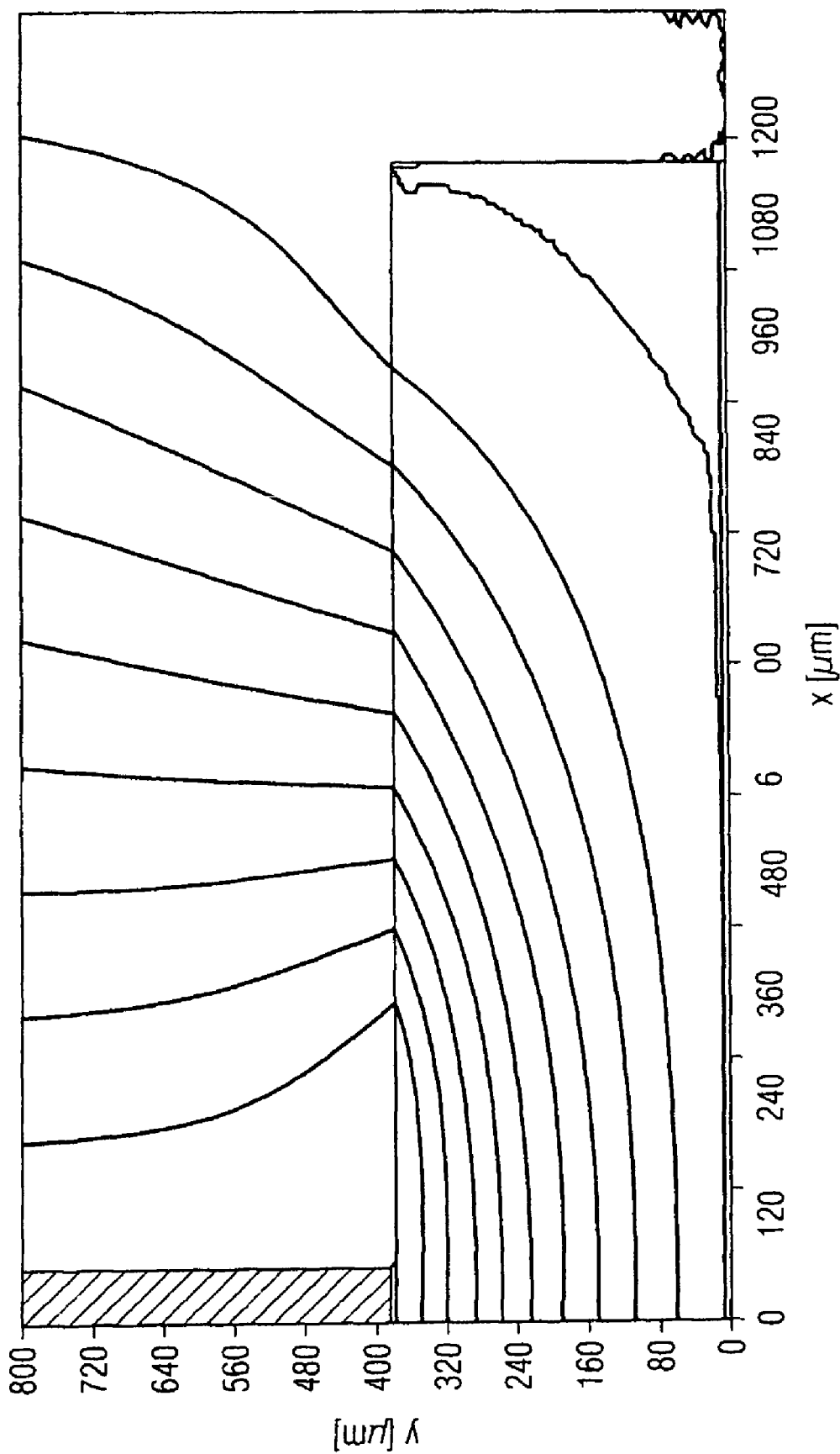
FIG. 5 is a graph illustrating the three-dimensional profile of the electrical potential in an embodiment of the semiconductor device according to the invention.

FIG. 5 illustrates the potential distribution for a structure of this type as also results from the simulation.

Figure 2:
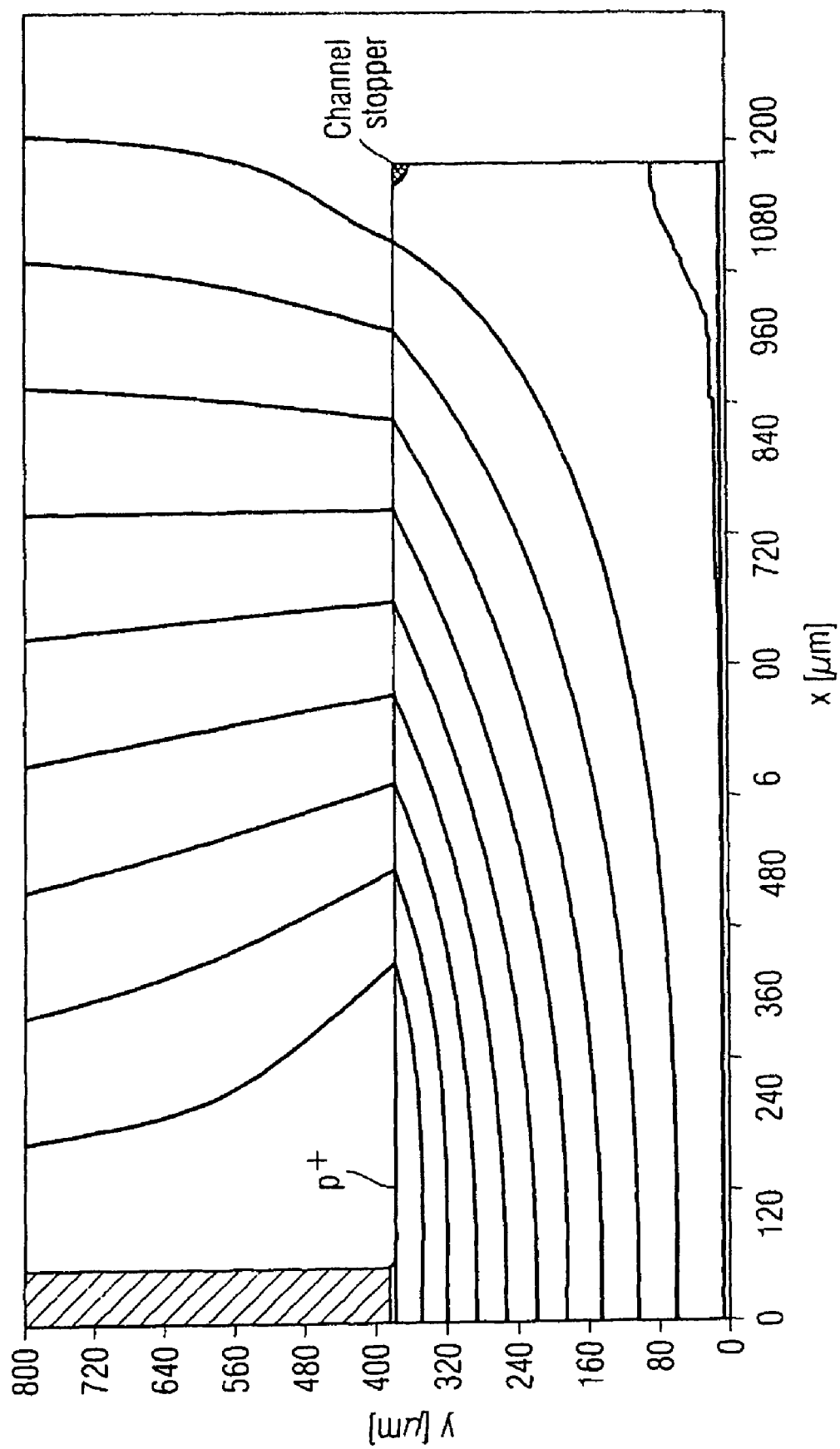
FIG. 2 illustrates a graph which diagrammatically depicts the potential profile for a known semiconductor device in the form of a sectional side view.

The underlying basis used was a constant positive surface charge density of $3 \cdot 10^{11}$ cm$^{-2}$ and a VLD maximum dose of $1.7 \cdot 10^{12}$ cm$^{-2}$. The channel stopper has been dispensed with. It can be seen that under these boundary conditions it is possible to reduce the edge from approximately 1200 μm to 850 μm without undesirable penetration of the space charge region into the chip edge. The voltage is now broken down exclusively on the chip top side to cathode-side potential. The blocking capability, at 4347 volts, is not significantly reduced compared to the situation illustrated in FIG. 2 and takes account of the reduction in potential over a narrower edge.

Figure 6:
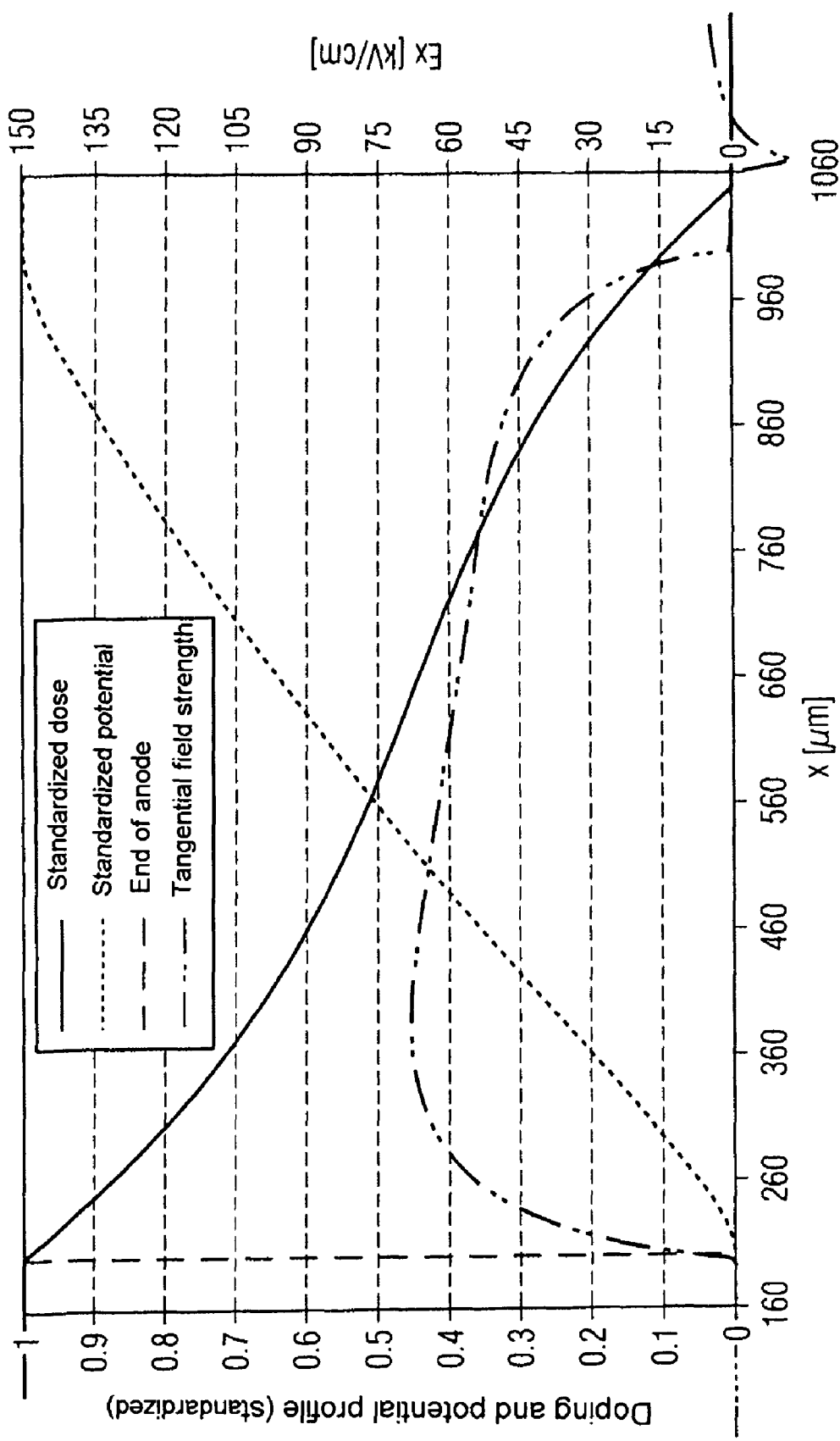
FIG. 6 is a graph illustrating the various component properties of an embodiment of the semiconductor device according to the invention.

A significant improvement is achieved with regard to the field strength peak at the channel stopper, FIG. 6. This peak can be completely eliminated by the counter-compensation on account of the donor charges, and critical field distributions do not occur anywhere at the semiconductor surface. Despite the edge reduction, the value is at all points below a very uncritical field strength of 70 kV/cm.

Figure 7:
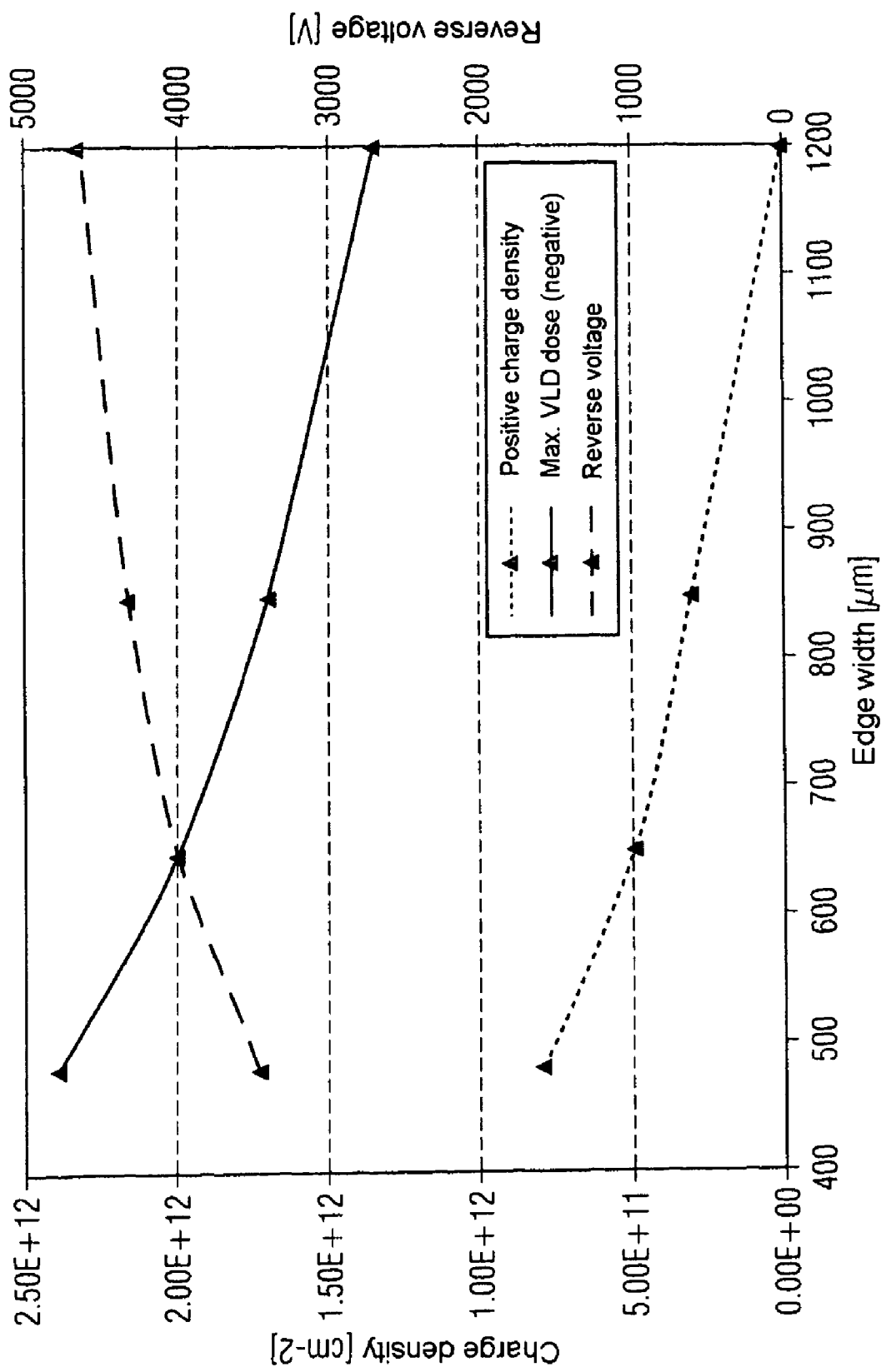
FIG. 7 is a graph illustrating the way in which certain component properties are dependent on the component dimensions.

If a certain trade-off in the blocking capability of the component is accepted, the edge, given an appropriate increase in the dose of the n-zone with an associated adjustment to the dose of the VLD zone, can be reduced still further. This is illustrated in FIG. 7.

The corresponding dose values result for all edge widths from the situation in which in the simulation the complete potential reduction can just still be achieved by means of the predetermined edge width.

Ultimately, a corresponding increase in the VLD dose, in combination with the concept of counter-compensation by the near-surface n-zone, brings about a considerable reduction in the sensitivity of the edge to foreign surface charges, with the simultaneous option of reducing the size of the edge. "Interfering charges" of this type originate, for example, from the potting compound in the case of the chip mounted in a housing.

Their influence is illustrated in FIG. 8, which plots the way in which the reverse voltage is dependent on a positive interfering charge for a situation without and with counter-compensation.

The structural principle which has been outlined can of course also be employed for the structure illustrated in FIG. 4 with inverted doping ratios and with correspondingly adapted dose values also for SiC.

One embodiment of the invention effectively reduces the space charge region and the field strength peak at the lateral end of the lightly doped zone in the case of a VLD edge termination by introducing a near-surface zone of constant or at least virtually constant doping of the opposite conduction type to the VLD doping, with this near-surface zone extending at least sufficiently far into the p-type area for its dose to become negligible with respect to the laterally varying VLD dose.

Figure 1:
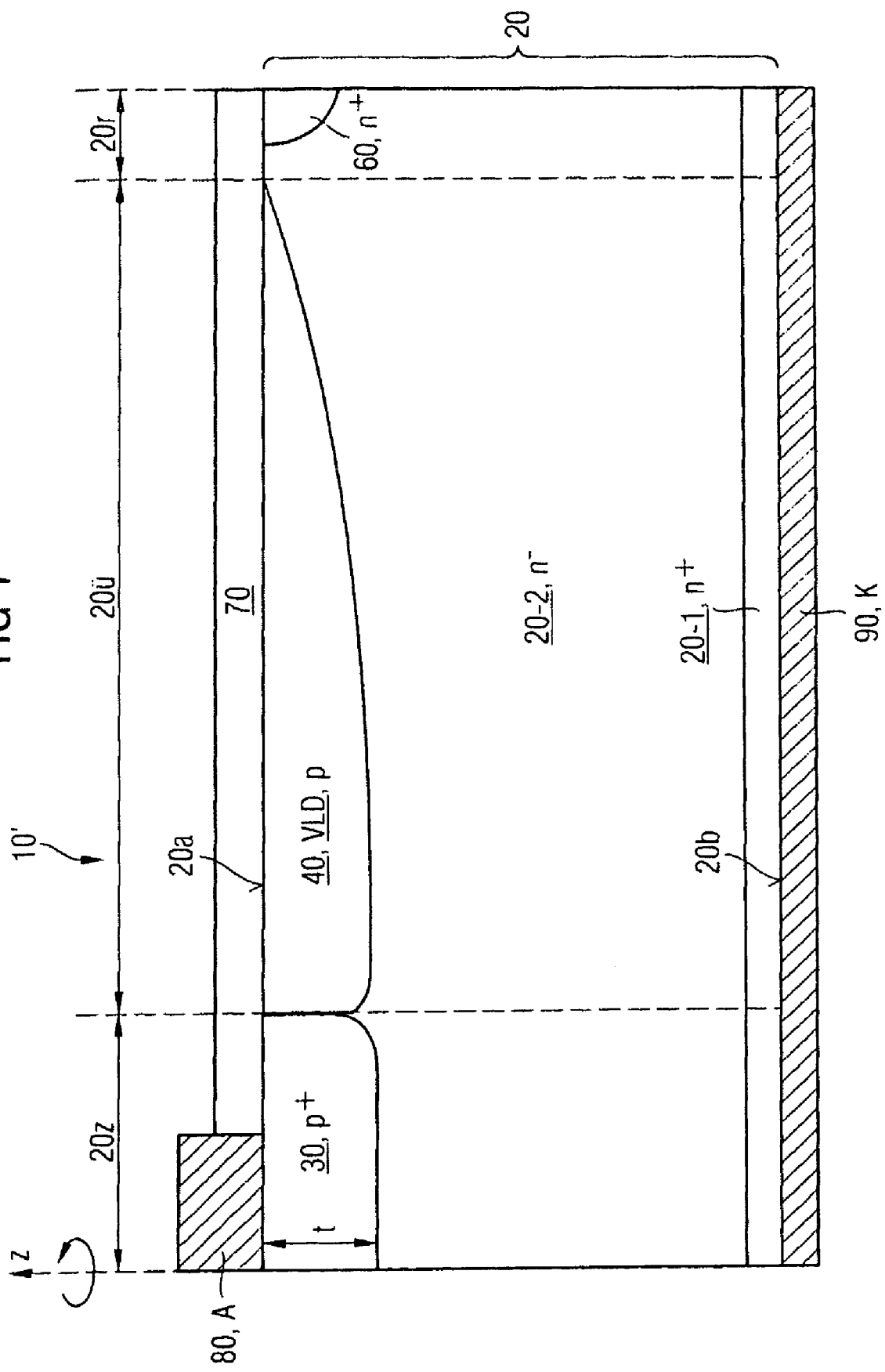
FIG. 1 illustrates a diagrammatic and sectional side view of a known semiconductor element.

FIG. 1 illustrates a diagrammatic and sectional side view of a known semiconductor device 10'. This conventional semiconductor device 10' is based on a semiconductor material region 20 with a surface region 20a. In the exemplary embodiment illustrated in FIG. 1, this semiconductor material region 20 is formed by a first and lower material region 20-1 with n$^+$-type doping and by a second and upper material region 20-2 with an n$^-$-type doping. A cathode K made from a cathode material 90 is provided on the rear side 20b of the semiconductor material region 20.

The semiconductor material region 20 is laterally divided, specifically into an active region 20z, which can also be referred to as the central region, a transition region 20ü and an adjoining edge region 20r. The edge region 20r actually also forms the edge of the conventional semiconductor device 10' in the narrower sense.

The active region 20z of the semiconductor material region 20 has an active area 30, specifically with a p$^+$-type doping, in the region of the surface 20a of the semiconductor material region 20. This active area 30 is in electrical terms directly connected to an anode A made from an anode material 80. The doping of the active area 30 extends, starting from the surface 20a of the semiconductor material region 20, down to a maximum depth t into the semiconductor material region 20.

The transition doping region 40, VLD, which is p-doped in form, laterally follows the active area 30 in the transition region 20ü of the semiconductor material region 30. In the embodiment illustrated in FIG. 4, the transition doping area 40 directly adjoins the active area 30. Starting from the surface 20a of the semiconductor material region 20, the doping of the transition doping area 40 extends, directly adjacent to the active area 30, for example initially likewise down to approximately the depth t, but the extent of the doping of the transition doping area 40, VLD drops toward the edge compared to the maximum depth t. This means that the p-type doping of the transition doping area 40, VLD is at its maximum in the vicinity of the active area 30 and then drops in monotone fashion in the direction of the edge region 20r.

In general terms, the depth t may be selected to be less than, greater than or equal to the junction depth of the active area, provided only that it is ensured that the areas 30, 40 are in contact with one another and/or overlap.

In the edge region 20r of the semiconductor material region 20 itself there is what is known as a channel stopper 60 with n$^+$-type doping. The surface 20a of the semiconductor material region 20 which is not occupied by the anode material 80 of the anode A is covered by a passivation layer 70 in the embodiment illustrated in FIG. 1.

The arrangement from FIG. 1 is, for example, considered rotationally symmetrical with respect to the axis of symmetry z illustrated at the left-hand edge of FIG. 1. However, square chips with an edge region which is merely curved in the chip corners are also conceivable.

Figure 3:
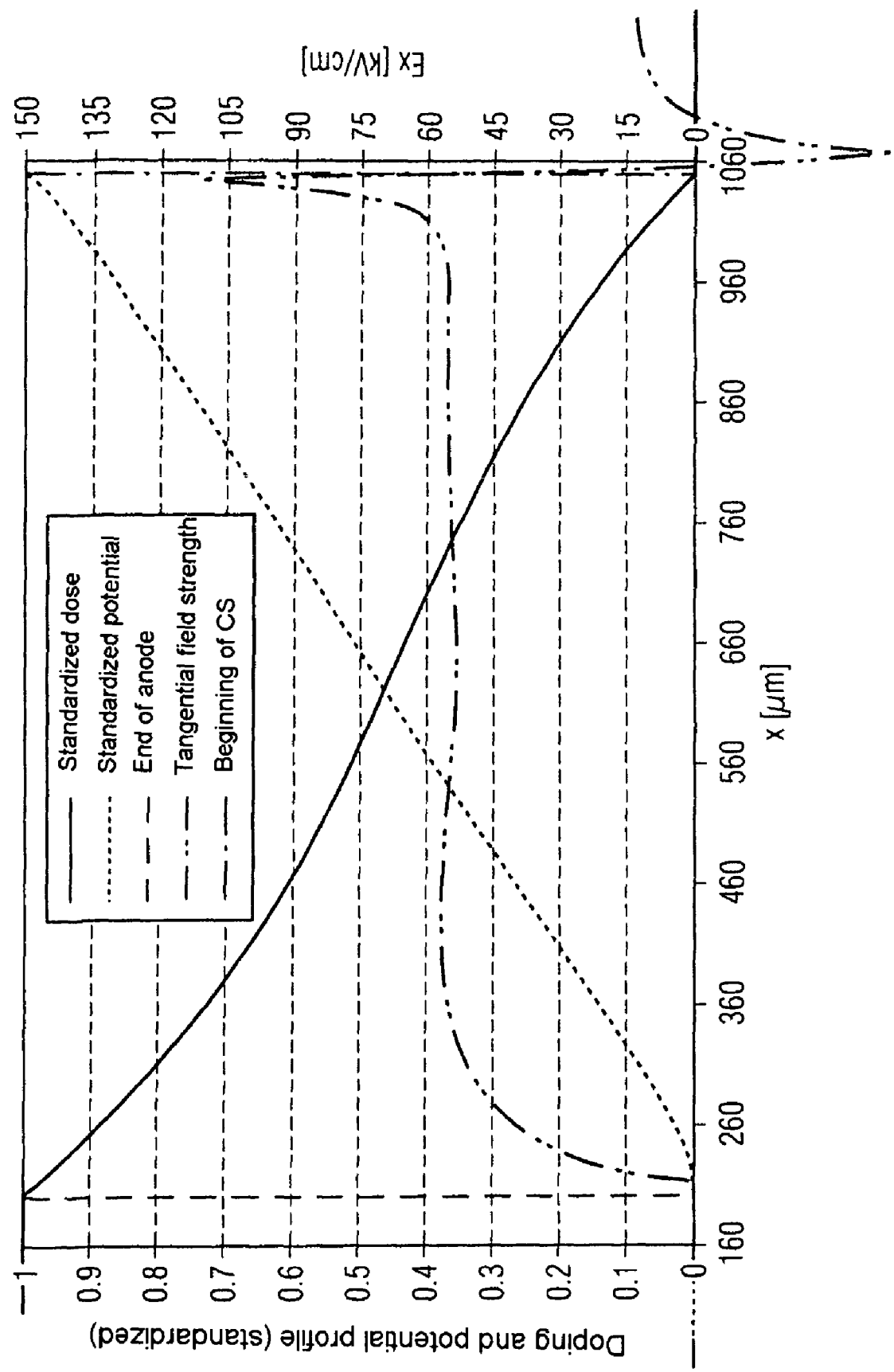
FIG. 3 illustrates various component parameters for a conventional embodiment of a semiconductor device.

As has been mentioned above and discussed in detail, FIGS. 2 and 3 illustrate graphs illustrating the potential profile or certain electrical properties of a conventional semiconductor device 10', which can be constructed as illustrated in FIG. 1 or in a similar form.

FIG. 4 likewise illustrates a diagrammatic and sectional side view, this time of a semiconductor device 10 as proposed according to one embodiment of the invention.

The structure illustrated in FIG. 4, in terms of its basic elements, substantially coincides with the structure from FIG. 1 for the conventional semiconductor device 10'. However, according to one embodiment of the invention significant differences are provided.

In the region of the p-type doping of the transition doping area 40 in the transition region 20ü of the semiconductor material region 20, according to one embodiment of the invention a near-surface compensation doping area 50, which has a doping that is opposite to the doping of the transition doping area 40, is provided in the vicinity of the surface. In the case illustrated in FIG. 4, this therefore means an n-type doping.

This n-type doping of the compensation doping area 50 is selected to be constant. If the p-type doping of the transition doping area 40, VLD is then formed so as to decrease laterally toward the edge, so that the p-type doping of the transition doping area 40, VLD is at its maximum directly adjacent to the active area 30 and drops to its minimum in the vicinity of the edge region 20r of the semiconductor material region 20, this has the effect that, as a result of the n-type doping of the compensation doping area 50 interacting with the p-type doping of the transition doping area 40, VLD, partial compensation takes place in the surface region 20a of the semiconductor material region 20, so that the doping in the surface region 20a of the semiconductor material region 20 still has a p-type doping in the immediate vicinity of the active area 30 in the transition doping area 40, VLD, whereas an n-type doping is already present in the vicinity of the edge region 20r of the semiconductor material region 30, on account of over-compensation.

On account of the provision of the compensation doping area 50 with n-type doping, it is possible to impose an appropriate field geometry or potential geometry, with the advantages according to the invention.

As has already been mentioned above, FIGS. 5 to 8 illustrates graphs depicting component properties of semiconductor devices according to embodiments the invention which may be constructed in the form illustrated in FIG. 4 or in similar form.

One embodiment of the invention provides a semiconductor device and a method for fabricating it in which edge structures which it is necessary to provide can be produced in a particularly simple yet reliable way.

One embodiment of the invention provides a semiconductor device in which a semiconductor material region having a surface region, having a lateral edge region, having an active region, which faces laterally away from the lateral edge region of the semiconductor material region, and having a transition region which is arranged laterally between the lateral edge region of the semiconductor material region and the active region of the semiconductor material region is provided. In the active region of the semiconductor material region an active area of the semiconductor device, in the form of a doping area with or of a first conductivity type is provided in the surface region of the semiconductor material region. In the transition region of the semiconductor material region a transition doping area with or of the first conductivity type is provided in the surface region of the semiconductor material region. The concentration of the first conductivity type in the transition doping area of the semiconductor device is designed to decrease in the direction of the lateral edge region of the semiconductor material region. In the transition region of the semiconductor material region or in part of it, a near-surface compensation doping area with or of a second conductivity type, which is different than or opposite to the first conductivity type of the transition doping area of the semiconductor material region, is provided in the surface region of the semiconductor material region. The doping in the near-surface compensation doping area of the semiconductor device at least partially compensates for the doping in the transition doping area of the semiconductor device or part of it or its action.

The semiconductor device according to one embodiment of the invention is for a near-surface compensation doping area to be formed in the transition region provided in the semiconductor material region or in part of it. Consequently, this compensation doping area is formed in the surface or in the surface region of the underlying semiconductor material region and has a conductivity type which differs from the conductivity type of the material of the transition doping area, for example being opposite thereto. Accordingly, the result of one embodiment of the invention is that as a result of the doping in the near-surface compensation doping area of the semiconductor device, the doping in the transition doping area of the semiconductor device or part of it or its action is at least partially compensated, with the result that defined component properties can be imposed with a high degree of reliability and in a particularly simple way without additional adjustment operations or mask processes.

In one embodiment of the semiconductor device according to the invention, it is provided that the doping in the near-surface compensation doping area of the semiconductor device is designed to be laterally constant or laterally virtually constant.

In another embodiment of the semiconductor device according to the invention, it is provided as an alternative or in addition that the doping in the near-surface compensation doping area of the semiconductor device is formed with a maximum value for the concentration or dose which is lower than the maximum value for the concentration or dose of the doping of the transition doping area of the semiconductor device.

In another embodiment of the semiconductor device according to the invention, it is provided as an alternative or in addition that the doping in the near-surface compensation doping area of the semiconductor device is formed with a maximum value for the depth of its profile which is lower than the maximum value for the depth of the profile of the doping of the transition doping area of the semiconductor device.

Furthermore, as an alternative or in addition it is provided that, in a further embodiment of the semiconductor device according to the invention, the active region of the semiconductor material region and the active area of the semiconductor device are formed with the same lateral extent or with an approximately corresponding lateral extent.

Furthermore, as an alternative or in addition it is conceivable that, according to another embodiment of the semiconductor device according to the invention, the transition region of the semiconductor material region and the transition doping region of the semiconductor device are formed with the same lateral extent or with an approximately corresponding lateral extent.

In another alternative or additional embodiment of the semiconductor device according to the invention, it is conceivable that the underlying semiconductor material region is formed with a first or lower and more heavily doped region and with a second or upper and more lightly doped region.

In another alternative or additional embodiment of the semiconductor device according to the invention, the underlying semiconductor material region may be formed with an n-type doping.

According to another alternative or additional embodiment of the semiconductor device according to the invention, a first or lower region of the semiconductor material region may be formed with an $n^+$-type doping.

Furthermore, as an alternative or in addition it is conceivable that, according to another embodiment of the semiconductor device according to the invention, the second or upper region of the semiconductor material region is formed with an $n^-$-type doping.

Also, as an alternative or in addition it is conceivable that, according to another embodiment of the semiconductor device according to the invention, the active area of the semiconductor device is formed with a $p^+$-type doping.

In another alternative or additional embodiment of the semiconductor device according to the invention, it is possible to provide that the transition doping area of the semiconductor device is formed with a p-type doping.

In another alternative or additional embodiment of the semiconductor device according to the invention, it is possible to provide that the active area of the semiconductor device is formed in the second or upper region of the semiconductor material region.

It is also conceivable that as an alternative or in addition, according to another embodiment of the semiconductor device according to the invention, the transition doping area of the semiconductor device is formed in the second or upper region of the semiconductor material region.

As an alternative or in addition, according to another embodiment of the semiconductor device according to the invention, the active area of the semiconductor device and the transition doping area of the semiconductor device may be formed with the same maximum depth, measured from the surface region of the semiconductor material region.

In another embodiment of the semiconductor device according to the invention, it is provided as an alternative or in addition that the active area of the semiconductor device and the transition doping area of the semiconductor device are formed laterally substantially directly adjacent to one another.

In another embodiment of the semiconductor device according to the invention, as an alternative or in addition it is provided that the concentration of the doping of the transition doping area of the semiconductor device is formed so as to decrease, starting from the surface region of the semiconductor material region.

Furthermore, according to another embodiment of the semiconductor device according to the invention, as an alternative or in addition it is provided that the concentration of the doping of the transition doping area of the semiconductor device is formed with a relatively high value in the surface region of the semiconductor material region and is formed with a relatively low value in the depth of the semiconductor material region.

Furthermore, as an alternative or in addition, in another embodiment of the semiconductor device according to the invention it is provided that the concentration of the doping of the transition doping area of the semiconductor device, starting from a side which faces the active area of the semiconductor device, is formed so as to decrease from the inside outward in the direction of the lateral edge region of the semiconductor material region.

Furthermore, as an alternative or in addition it is provided that, in another embodiment of the semiconductor device according to the invention, the concentration of the doping of the transition doping area of the semiconductor device is formed so as to have a concentration profile which goes deeper on the side facing the active area and goes less deep on the side facing the lateral edge region.

Furthermore, as an alternative or in addition, it is possible to provide that, in one embodiment of the semiconductor device according to the invention, the concentration of the doping of the transition doping area of the semiconductor device is formed so as to have a concentration profile which runs in monotone fashion from the side facing the active area to the side facing the lateral edge region.

Furthermore, in another embodiment of the semiconductor device according to the invention, the concentration of the doping of the transition doping region is formed, as an alternative or in addition, with a local strength which decreases from the inside outward from the side facing the active area to the side facing the edge area of the semiconductor material region.

The semiconductor device may be designed, for example, as a power semiconductor device.

The semiconductor device may be designed in particular as a diode, an IGBT, an FET or a bipolar transistor or may be designed to include one such component or a plurality of such components.

Another aspect of the present invention proposes a method for fabricating semiconductor device, in which a semiconductor material region having a surface region, having a lateral edge region, having an active region, which faces laterally away from the lateral edge region of the semiconductor material region, and having a transition region which is arranged laterally between the lateral edge region of the semiconductor material region and the active region of the semiconductor material region is provided. In the active region of the semiconductor material region an active area of the semiconductor device, in the form of a doping area with or of a first conductivity type is provided in the surface region of the semiconductor material region. In the transition region of the semiconductor material region a transition doping area with or of the first conductivity type is provided in the surface region of the semiconductor material region. The concentration of the first conductivity type in the transition doping area of the semiconductor device is designed to decrease in the direction of the lateral edge region of the semiconductor material region. In the transition region of the semiconductor material region or in part of it, a near-surface compensation doping area with or of a second conductivity type, which is different than or opposite to the first conductivity type of the transition doping area of the semiconductor material region, is provided in the surface region of the semiconductor material region. The doping in the near-surface compensation doping area of the semiconductor device at least partially compensates for the doping in the transition doping area of the semiconductor device or part of it or its action.

In one embodiment of the method according to the invention for fabricating a semiconductor device, it is provided that the doping in the near-surface compensation doping area of the semiconductor device is designed to be laterally constant or laterally virtually constant.

In another embodiment of the method according to the invention for fabricating a semiconductor device, it is provided as an alternative or in addition that the doping in the near-surface compensation doping area of the semiconductor device is formed with a maximum value for the concentration or dose which is lower than the maximum value for the concentration or dose of the doping of the transition doping area of the semiconductor device.

In another embodiment of the method according to the invention for fabricating a semiconductor device, it is provided as an alternative or in addition that the doping in the near-surface compensation doping area of the semiconductor device is formed with a maximum value for the depth of its profile which is lower than the maximum value for the depth of the profile of the doping of the transition doping area of the semiconductor device.

Furthermore, as an alternative or in addition it is provided that, in another embodiment of the method according to the invention for fabricating a semiconductor device, the active region of the semiconductor material region and the active area of the semiconductor device are formed with the same lateral extent or with an approximately corresponding lateral extent.

Furthermore, as an alternative or in addition it is conceivable that, according to another embodiment of the method according to the invention for fabricating a semiconductor device, the transition region of the semiconductor material region and the transition doping region of the semiconductor device are formed with the same lateral extent or with an approximately corresponding lateral extent.

In another alternative or additional embodiment of the method according to the invention for fabricating a semiconductor device, it is conceivable that the underlying semiconductor material region is formed with a first or lower and more heavily doped region and with a second or upper and more lightly doped region.

In another alternative or additional embodiment of the method according to the invention for fabricating a semiconductor device, the underlying semiconductor material region may be formed with an n-type doping.

According to another alternative or additional embodiment of the method according to the invention for fabricating a semiconductor device, a first or lower region of the semiconductor material region may be formed with an $n^+$-type doping.

Furthermore, as an alternative or in addition, it is conceivable that, according to another embodiment of the method according to the invention for fabricating a semiconductor device, the second or upper region of the semiconductor material region is formed with an $n^-$-type doping.

Also, as an alternative or in addition it is conceivable that, according to another embodiment of the method according to the invention for fabricating a semiconductor device, the active area of the semiconductor device is formed with a $p^+$-type doping.

In another alternative or additional embodiment of the method according to the invention for fabricating a semiconductor device, it is possible to provide that the transition doping area of the semiconductor device is formed with a p-type doping.

In another alternative or additional embodiment of the method according to the invention for fabricating a semiconductor device, it is possible to provide that the active area of the semiconductor device is formed in the second or upper region of the semiconductor material region.

It is also conceivable that, as an alternative or in addition, according to another embodiment of the method according to the invention for fabricating a semiconductor device, the transition doping area of the semiconductor device is formed in the second or upper region of the semiconductor material region.

As an alternative or in addition, according to another embodiment of the method according to the invention for fabricating a semiconductor device, the active area of the semiconductor device and the transition doping area of the semiconductor device may be formed with the same maximum depth, measured from the surface region of the semiconductor material region.

In another embodiment of the method according to the invention for fabricating a semiconductor device, it is as an alternative or in addition provided that the active area of the semiconductor device and the transition doping area of the semiconductor device are formed laterally substantially directly adjacent to one another.

In another embodiment of the method according to the invention for fabricating a semiconductor device, it is as an alternative or in addition provided that the concentration of the doping of the transition doping area of the semiconductor device is formed so as to decrease, starting from the surface region of the semiconductor material region.

Furthermore, according to another embodiment of the method according to the invention for fabricating a semiconductor device, it is as an alternative or in addition provided that the concentration of the doping of the transition doping area of the semiconductor device is formed with a relatively high value in the surface region of the semiconductor material region and is formed with a relatively low value in the depth of the semiconductor material region.

Furthermore, as an alternative or in addition, in another embodiment of the method according to the invention for fabricating a semiconductor device, it is provided that the concentration of the doping of the transition doping area of the semiconductor device, starting from a side which faces the active area of the semiconductor device, is formed so as to decrease from the inside outward in the direction of the lateral edge region of the semiconductor material region.

Furthermore, as an alternative or in addition it is provided that in another embodiment of the method according to the invention for fabricating a semiconductor device, the concentration of the doping of the transition doping area of the semiconductor device is formed so as to have a concentration profile which goes deeper on the side facing the active area and goes less deep on the side facing the lateral edge region.

Furthermore, as an alternative or in addition it is possible to provide that, in one embodiment of the method according to the invention for fabricating a semiconductor device, the concentration of the doping of the transition doping area of the semiconductor device is formed so as to have a concentration profile which runs in monotone fashion from the side facing the active area to the side facing the lateral edge region.

In another embodiment of the method according to the invention for fabricating a semiconductor device, as an alternative or in addition, the concentration of the doping of the transition doping region is formed with a local strength which decreases from the inside outward from the side facing the active area to the side facing the edge area of the semiconductor material region.

The semiconductor device may be designed, for example, as a power semiconductor device.

The semiconductor device may also be designed as a diode, an IGBT, an FET or a bipolar transistor or may be designed to include one such component or a plurality of such components.

These and further aspects of the present invention are explained in more detail below:

One embodiment of the invention relates to a VLD edge termination with a near-surface zone of an opposite conduction type.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device comprising:
   a semiconductor material region having a surface region, having a lateral edge region at an edge of a chip including the semiconductor device, having an active region, which faces laterally away from the lateral edge region of the semiconductor material region, and having a transition region which is arranged laterally between the lateral edge region of the semiconductor material region and the active region of the semiconductor material region;
   an active area of the semiconductor device in the active region and in the surface region of the semiconductor material region, in the form of a doping area with or of a first conductivity type;
   a transition doping area in the transition region and in the surface region of the semiconductor material region and not directly below the active region with or of the first conductivity type;
   wherein the concentration of the first conductivity type in the transition doping area of the semiconductor device decreases in the direction of the lateral edge region of the semiconductor material region;
   an additional near-surface compensation doping area with or of a second conductivity type, in the transition region and in the surface region of the semiconductor material region or in part of it, which is different than or opposite to the first conductivity type of the transition doping area of the semiconductor material region, the additional near-surface compensation doping area extending from adjacent the active region to adjacent the lateral edge region and substantially vertically above the transition doping area; and
   wherein the doping in the additional near-surface compensation doping area of the semiconductor device at least partially compensates for the doping in the transition doping area of the semiconductor device or part of it or its action.

2. The semiconductor of claim 1, wherein the doping in the near-surface compensation doping area of the semiconductor device is laterally constant or laterally virtually constant.

3. The semiconductor device of claim 1, wherein the doping in the additional near-surface compensation doping area of the semiconductor device has a distribution of the doping concentration comprising a maximum value that is below the maximum value of the doping concentration distribution of the transition doping area of the semiconductor device.

4. The semiconductor device of claim 1,
wherein the doping in the near-surface compensation doping area of the semiconductor device is formed with a maximum value for the depth of its profile which is lower than the maximum value for the depth of the profile of the doping of the transition doping area of the semiconductor device;
wherein the active region of the semiconductor material region and the active area of the semiconductor device are formed with the same lateral extent or with an approximately corresponding lateral extent; and
wherein the transition region of the semiconductor material region and the transition doping region of the semiconductor device are formed with the same lateral extent or with an approximately corresponding lateral extent.

5. The semiconductor device of claim 1,
wherein the underlying semiconductor material region is formed with a lower and more heavily doped region and with an upper and more lightly doped region;
wherein the underlying semiconductor material region is formed with an n-type doping;
wherein the lower region of the semiconductor material region is formed with an $n^+$-type doping;
wherein the upper region of the semiconductor material region is formed with an $n^-$-type doping;
wherein the active area of the semiconductor device is formed with a $p^+$-type doping;
wherein the transition doping area of the semiconductor device is formed with a p-type doping;
wherein the active area of the semiconductor device is formed in the second or upper region of the semiconductor material region; and
wherein the transition doping area of the semiconductor device is formed in the second or upper region of the semiconductor material region.

6. The semiconductor device of claim 1,
wherein the active area of the semiconductor device is formed with a maximum depth, measured from the surface region of the semiconductor material region, which is lower than, greater than or equal to that of the transition doping area of the semiconductor device;
wherein the two areas in particular touch one another or overlap; and
wherein the active area of the semiconductor device and the transition doping area of the semiconductor device are formed laterally substantially directly adjacent to one another.

7. The semiconductor device of claim 1,
wherein the concentration of the doping of the transition doping area of the semiconductor device is formed so as to decrease, starting from the surface region of the semiconductor material region;
wherein the concentration of the doping of the transition doping area of the semiconductor device is formed with a relatively high value in the surface region of the semiconductor material region and is formed with a relatively low value in the depth of the semiconductor material region; and
wherein the concentration of the doping of the transition doping area of the semiconductor device, starting from a side which faces the active area of the semiconductor device, is formed so as to decrease from the inside outward in the direction of the lateral edge region of the semiconductor material region.

8. The semiconductor device of claim 1,
wherein the concentration of the doping of the transition doping area of the semiconductor device is formed so as to have a concentration profile which goes deeper on the side facing the active area and goes less deep on the side facing the lateral edge region;
wherein the concentration of the doping of the transition doping area of the semiconductor device is formed so as to have a concentration profile which runs in monotone fashion from the side facing the active area to the side facing the lateral edge region; and
wherein the concentration of the doping of the transition doping region is formed with a local strength which decreases from the inside outward from the side facing the active area to the side facing the edge area of the semiconductor material region.

9. The semiconductor device of claim 1 configured as one of the group comprising a power semiconductor device, a diode, an IGBT, an FET and a bipolar transistor.

10. A method for fabricating a semiconductor device comprising:
providing a semiconductor material region having a surface region, having a lateral edge region at an edge of a chip including the semiconductor device, having an active region, which faces laterally away from the lateral edge region of the semiconductor material region, and having a transition region which is arranged laterally between the lateral edge region of the semiconductor material region and the active region of the semiconductor material region;
providing an active area of the semiconductor device, in the form of a doping area with or of a first conductivity type in the surface region and in the active region of the semiconductor material region;
providing a transition doping area with or of the first conductivity type in the transition region and the surface region of the semiconductor material region and not directly below the active region;
designing the concentration of the first conductivity type in the transition doping area of the semiconductor device to decrease in the direction of the lateral edge region of the semiconductor material region;
providing an additional near-surface compensation doping area in the transition region and the surface region of the semiconductor material region with or of a second conductivity type, which is different than or opposite to the first conductivity type of the transition doping area of the semiconductor material region, such that the additional near-surface compensation doping area extends from adjacent the active region to adjacent the lateral edge region; and
wherein the doping in the near-surface compensation doping area of the semiconductor device at least partially compensates for the doping in the transition doping area of the semiconductor device or part of it or its action.

11. The method of claim 10 further comprising designing the doping in the near-surface compensation doping area of the semiconductor device laterally constant or laterally virtually constant.

12. The method of claim 10 further comprising forming the doping in the near-surface compensation doping area of the semiconductor device with a maximum value for the concentration or dose which is lower than the maximum value for the concentration or dose of the doping of the transition doping area of the semiconductor device.

13. The method of claim 10 further comprising:
forming the doping in the near-surface compensation doping area of the semiconductor device with a maximum value for the depth of its profile which is lower than the maximum value for the depth of the profile of the doping of the transition doping area of the semiconductor device;

forming the active region of the semiconductor material region and the active area of the semiconductor device are formed with the same lateral extent or with an approximately corresponding lateral extent; and forming the transition region of the semiconductor material region and the transition doping region of the semiconductor device with the same lateral extent or with an approximately corresponding lateral extent.

14. The method of claim 10 further comprising:

forming the underlying semiconductor material region with a lower and more heavily doped region and with an upper and more lightly doped region;

forming the underlying semiconductor material region with an n-type doping;

forming the lower region of the semiconductor material region with an $n^+$-type doping;

forming the upper region of the semiconductor material region with an $n^-$-type doping;

forming the active area of the semiconductor device with a $p^+$-type doping;

forming the transition doping area of the semiconductor device with a p-type doping;

forming the active area of the semiconductor device in the upper region of the semiconductor material region; and forming the transition doping area of the semiconductor device in the upper region of the semiconductor material region.

15. The method of claim 10 further comprising:

forming the active area of the semiconductor device and the transition doping area of the semiconductor device with the same maximum depth, measured from the surface region of the semiconductor material region; forming forming the active area of the semiconductor device and the transition doping area of the semiconductor device laterally substantially directly adjacent to one another.

16. The method of claim 10 further comprising forming the concentration of the doping of the transition doping area of the semiconductor device so as to decrease, starting from the surface region of the semiconductor material region; and forming the concentration of the doping of the transition doping area of the semiconductor device with a relatively high value in the surface region of the semiconductor material region and with a relatively low value in the depth of the semiconductor material region.

17. The method of claim 10 further comprising forming the concentration of the doping of the transition doping area of the semiconductor device, starting from a side which faces the active area of the semiconductor device, so as to decrease from the inside outward in the direction of the lateral edge region of the semiconductor material region; and forming the concentration of the doping of the transition doping area of the semiconductor device so as to have a concentration profile which goes deeper on the side facing the active area and goes less deep on the side facing the lateral edge region.

18. The method of claim 10 further comprising forming the concentration of the doping of the transition doping area of the semiconductor device so as to have a concentration profile which runs in monotone fashion from the side facing the active area to the side facing the lateral edge region; and forming the concentration of the doping of the transition doping region with a local strength which decreases from the inside outward from the side facing the active area to the side facing the edge area of the semiconductor material region.

19. The method of claim 10 further comprising designing the semiconductor device as one of the group comprising a power semiconductor device, a diode, an IGBT, an FET and a bipolar transistor.

20. A semiconductor device comprising:

a semiconductor material region having a surface region, having a lateral edge region at an edge of a chip including the semiconductor device, having an active region, which faces laterally away from the lateral edge region, and having a transition region, which is arranged laterally between the lateral edge region and the active region;

an active area of the semiconductor device in the active region and in the surface region, in the form of a doping area with or of a first conductivity type;

a transition doping area in the transition region and in the surface region with or of the first conductivity type and not directly below the active region;

means in the transition doping area for decreasing the concentration of the first conductivity type in the direction of the lateral edge region of the semiconductor material region;

an additional near-surface compensation doping area with or of a second conductivity type, in the transition region and in the surface region, which is different than or opposite to the first conductivity type of the transition doping area, the additional near-surface compensation doping area extending from adjacent the active region to adjacent the lateral edge region and substantially vertically above the transition doping area; and means in the additional near-surface compensation doping area for at least partially compensating for doping in the transition doping area of the semiconductor device.

* * * * *